(12) United States Patent
Shiraishi

(10) Patent No.: US 9,572,204 B2
(45) Date of Patent: Feb. 14, 2017

(54) LIGHTING DEVICE HAVING SEALING MEMBER COVERING INSIDE OF WALL MEMBER SURROUNDING LIGHT EMITTING ELEMENTS

(71) Applicant: Toshiba Lighting & Technology Corporation, Yokosuka-shi, Kanagawa-ken (JP)

(72) Inventor: Hiromitsu Shiraishi, Yokosuka (JP)

(73) Assignee: Toshiba Lighting & Technology Corporation, Yokosuka-shi, Kanagawa-ken (JP)

( * ) Notice: Subject to any disclaimer, the term of this patent is extended or adjusted under 35 U.S.C. 154(b) by 0 days.

(21) Appl. No.: 14/770,619

(22) PCT Filed: Aug. 22, 2013

(86) PCT No.: PCT/JP2013/072448
§ 371 (c)(1),
(2) Date: Aug. 26, 2015

(87) PCT Pub. No.: WO2014/155765
PCT Pub. Date: Oct. 2, 2014

(65) Prior Publication Data
US 2016/0014855 A1    Jan. 14, 2016

(30) Foreign Application Priority Data
Mar. 28, 2013  (JP) .................................. 2013-070197

(51) Int. Cl.
*H01L 27/15*    (2006.01)
*H05B 33/06*    (2006.01)
(Continued)

(52) U.S. Cl.
CPC .................. *H05B 33/06* (2013.01); *F21K 9/00* (2013.01); *H01L 33/62* (2013.01); *H05B 33/04* (2013.01);
(Continued)

(58) Field of Classification Search
CPC ............. H05B 3/06; H05B 3/04; H01L 33/62; H01L 2224/49113; H01L 2224/48247; H01L 2924/0002; H01L 25/0753; H01L 33/52; F21K 9/00; F21Y 2115/10; F21Y 2101/00; F21Y 2105/10
(Continued)

(56) References Cited

U.S. PATENT DOCUMENTS 8,390,193 B2 * 3/2013 Li ........................... F21S 10/02
                                                   313/506
9,018,832 B2    4/2015 Agatani et al.
(Continued)

FOREIGN PATENT DOCUMENTS

GB    2458972 A    10/2009
JP    2007-176219 A    7/2007
(Continued)

OTHER PUBLICATIONS

Translation of the International Search for JP2013/072448, Nov. 2013.*
(Continued)

*Primary Examiner* — Tracie Y Green
(74) *Attorney, Agent, or Firm* — Banner & Witcoff, Ltd.

(57) ABSTRACT

A lighting device includes a body section; a substrate provided in the body section; a wiring pattern provided on a surface of the substrate and including wiring pads; and light emitting elements provided on the wiring pattern and including electrodes in the vicinity of a circumferential edge of a surface opposite to a side on which the wiring pattern
(Continued)

is provided. The lighting device also includes wirings that respectively connect the wiring pads and a plurality of electrodes; a surrounding wall member provided to surround the light emitting elements and having an annular shape; and a sealing section provided to cover the inside of the surrounding wall member. At least a part of the light emitting elements is connected in series. The electrodes are respectively positioned on or inside a circumference passing through centers of the light emitting elements which are connected in series.

6 Claims, 12 Drawing Sheets

(51) Int. Cl.
  F21K 99/00      (2016.01)
  H05B 33/04     (2006.01)
  H01L 33/62     (2010.01)
  H01L 25/075    (2006.01)
  H01L 33/52     (2010.01)
  F21Y 101/00    (2016.01)

(52) U.S. Cl.
  CPC ......... F21Y 2101/00 (2013.01); F21Y 2105/10 (2016.08); F21Y 2115/10 (2016.08); H01L 25/0753 (2013.01); H01L 33/52 (2013.01); H01L 2224/48247 (2013.01); H01L 2224/49113 (2013.01); H01L 2924/0002 (2013.01)

(58) Field of Classification Search
  USPC .................................. 313/512, 511, 506–507
  See application file for complete search history.

(56) References Cited

U.S. PATENT DOCUMENTS

| | | |
|---|---|---|
| 9,203,007 B2 | 12/2015 | Lee et al. |
| 2002/0008314 A1* | 1/2002 | Takeuchi ............. H01L 23/642 257/697 |
| 2008/0224608 A1* | 9/2008 | Konishi .................... F21K 9/00 313/505 |
| 2012/0056217 A1 | 3/2012 | Jung et al. |
| 2012/0080713 A1 | 4/2012 | Agatani et al. |
| 2012/0236532 A1 | 9/2012 | Koo et al. |
| 2013/0020552 A1* | 1/2013 | Kazama ................ H01L 33/405 257/13 |
| 2014/0217433 A1* | 8/2014 | Tudorica ................. H01L 33/56 257/89 |
| 2014/0268783 A1 | 9/2014 | Agatani et al. |
| 2015/0034979 A1 | 2/2015 | Lee et al. |
| 2015/0041835 A1 | 2/2015 | Agatani et al. |

FOREIGN PATENT DOCUMENTS

| | | |
|---|---|---|
| JP | 2009-021264 A | 1/2009 |
| JP | 2009-164209 A | 7/2009 |
| JP | 2011-192602 A | 9/2011 |
| JP | 2012-043750 A | 3/2012 |
| JP | 2012-079855 A | 4/2012 |
| JP | 2012-109478 A | 6/2012 |
| WO | 2012/108636 A2 | 8/2012 |
| WO | 2012/165819 | 12/2012 |

OTHER PUBLICATIONS

Nov. 12, 2013—International Search Report—Intl App PCT/JP2013/072448.
Nov. 12, 2013—(WO) Translation of the Written Opinion of the ISA—Intl App PCT/JP2013/072448, Eng Tran.
Sep. 16, 2016—(EP) Extended Search Report—App 13879893.9.

* cited by examiner

LIGHTING DEVICE HAVING SEALING MEMBER COVERING INSIDE OF WALL MEMBER SURROUNDING LIGHT EMITTING ELEMENTS

TECHNICAL FIELD

Embodiments described herein generally relate to a lighting device.

BACKGROUND ART

There is a lighting device having a plurality of light emitting elements such as Light Emitting Diode (LED).

In the lighting device having the plurality of light emitting elements, the plurality of light emitting elements are arranged on circumference on a substrate or the plurality of light emitting elements are arranged in an array shape (vertical and horizontal arrangement).

Furthermore, the light emitting elements and a wiring pattern on a surface of the substrate are electrically connected by wiring.

Then, the plurality of light emitting elements arranged as described above and the wiring are sealed by a resin molded section, that is, by a sealing section.

Here, heat stress, expansion, and contraction are generated in the sealing section by turning on and turning off of the light emitting elements. In this case, if the volume of the sealing section is great, influences of the heat stress, the expansion, and the contraction of the sealing section are large, and there is a concern that defects occur in a part of the plurality of light emitting elements and a plurality of wirings sealed by the sealing section.

For example, there is a concern that the light emitting elements are separated from the substrate or the wiring is disconnected.

Thus, it is preferable that the volume of the sealing section is small as much as possible.

However, if the plurality of light emitting elements are regularly arranged on the substrate and the plurality of light emitting elements which are regularly arranged are simply sealed by the sealing section, there is a concern that the volume of the sealing section is increased.

Furthermore, a distance in which wiring crosses above an upper surface of the light emitting element which is a light emitting surface is increased, emitted light is blocked by the wiring, and thus there is a concern that light extraction efficiency is deteriorated.

CITATION LIST

Patent Literature

[PTL 1] JP-A-2007-176219
[PTL 2] JP-A-2009-21264

SUMMARY OF INVENTION

Technical Problem

An object of the invention is to provide a lighting device in which the volume of a sealing section can be decreased and a light extraction efficiency can be improved.

Solution to Problem

A lighting device according to an embodiment includes a body section; a substrate that is provided in the body section; a wiring pattern that is provided on a surface of the substrate and has a plurality of wiring pads; a plurality of light emitting elements that are provided on the wiring pattern and have electrodes in the vicinity of a the circumference edge of a surface opposite to a side on which the wiring pattern is provided; a plurality of wirings that respectively connect the plurality of wiring pads and a plurality of electrodes; a surrounding wall member that is provided so as to surround the plurality of light emitting elements and has an annular shape; and a sealing section that is provided so as to cover the inside of the surrounding wall member.

Then, at least a part of the plurality of light emitting elements is connected in series. The plurality of electrodes are respectively positioned on or inside a circumference passing through centers of the plurality of light emitting elements which are connected in series centered on a first position in electric connection between the light emitting element and the light emitting element in the plurality of light emitting elements connected in series.

Advantageous Effects of Invention

According to the embodiments of the invention, it is possible to provide a lighting device in which the volume of a sealing section can be decreased and a light extraction efficiency can be improved.

DESCRIPTION OF EMBODIMENTS

Figure 1:
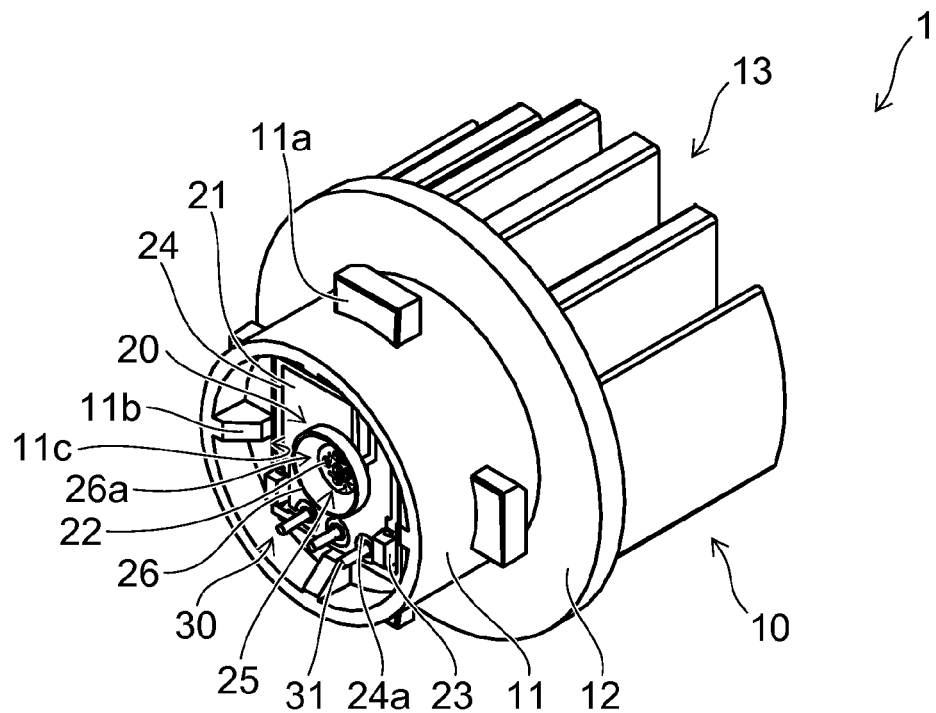
FIG. 1 is a schematic perspective view illustrating a lighting device according to an embodiment.

A first invention is a lighting device including a body section; a substrate that is provided in the body section; a wiring pattern that is provided on a surface of the substrate and has a plurality of wiring pads; a plurality of light emitting elements that are provided on the wiring pattern and have electrodes in the vicinity of a the circumference edge of a surface opposite to a side on which the wiring pattern is provided; a plurality of wirings that respectively connect the plurality of wiring pads and a plurality of electrodes; a surrounding wall member that is provided so as to surround the plurality of light emitting elements and has an annular shape; and a sealing section that is provided so as to cover the inside of the surrounding wall member.

Then, at least a part of the plurality of light emitting elements is connected in series. The plurality of electrodes are respectively positioned on or inside a circumference passing through centers of the plurality of light emitting elements which are connected in series centered on a first position in electric connection between the light emitting element and the light emitting element in the plurality of light emitting elements connected in series.

In the lighting device, it is possible to make the connection portion between the wiring and the wiring pattern (wiring pad) be close to the vicinity of the first position. Thus, it is possible to decrease a size of the surrounding wall member and to decrease the volume of the sealing section.

Furthermore, it is possible to shorten a distance in which the wiring crosses above an upper surface of the light emitting element which is a light emitting surface and to improve light extraction efficiency.

Furthermore, since the surrounding wall member is provided in the lighting device, it is possible to regulate the volume (capacity for being filled (injected) with resin and the like) of the sealing section to a small capacity (small range). Thus, it is possible to suppress stress, expansion, and contraction of the sealing section to be lower than a sealing section having a large capacity. As a result, it is possible to suppress influences on a part of the plurality of light emitting elements and the wirings sealed by the sealing section, for example, separation of the light emitting element or disconnection of the wiring.

Furthermore, in the lighting device, since the volume of the sealing section has a small capacity, it is possible to suppress occurrence of cracks of the sealing section to be lower than that of the sealing section having a large capacity. As a result, sealing performance of the sealing section can be improved, and thus it is possible to improve a yield of manufacture of the lighting device.

Furthermore, in the lighting device, since the volume of the sealing section is the small capacity, it is possible to reduce manufacturing cost. Furthermore, a time for filling the sealing section can be reduced, and thus it is possible to shorten a manufacturing time and reduce the manufacturing cost.

In a second invention according to the first invention, positions of the respective electrodes have a rotational symmetry centered on the first position in the electric connection between the light emitting element and the light emitting element in the plurality of light emitting elements connected in series.

In the lighting device, it is possible to further decrease the volume of the sealing section and to improve the light extraction efficiency.

In a third invention according to the first or second invention, the plurality of light emitting elements are respectively provided in positions where distances between the plurality of wiring pads and the plurality of electrodes respectively become the shortest.

In the lighting device, it is possible to further decrease the volume of the sealing section and to improve the light extraction efficiency.

In a fourth invention according to any one of the first to third inventions, the wiring pattern has a plurality of mounting pads to which the plurality of light emitting elements are respectively connected. Then, the plurality of electrodes, and connection portions between the wiring pads and the wirings are positioned inside circumference passing through outermost circumference end of the plurality of mounting pads centered on the first position.

In the lighting device, it is possible to further decrease the volume of the sealing section and to improve the light extraction efficiency.

In a fifth invention according to any one of the first to fourth inventions, the lighting device further includes a power supplying terminal of which one end is electrically connected to the wiring pattern and the other end is exposed from the opposite side of a side of the body section on which the substrate is provided.

Hereinafter, embodiments will be illustrated with reference to the drawings. Moreover, in each view, the same reference numerals are given to the same configuration elements and detailed description will be appropriately omitted.

Figure 2:
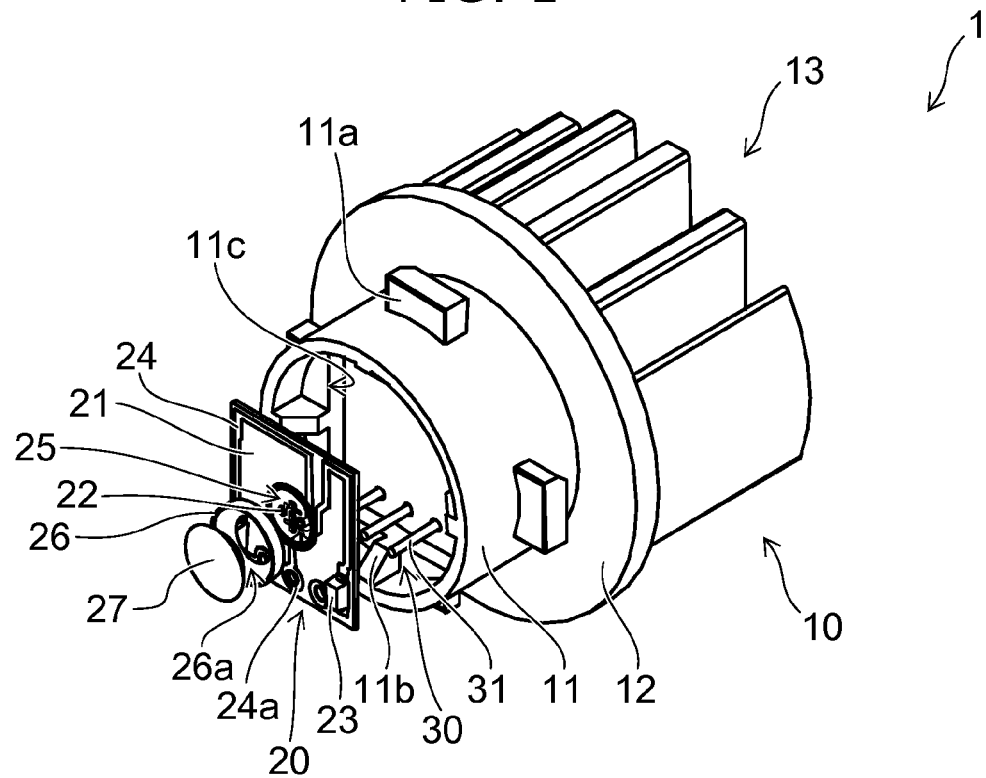
FIG. 2 is a schematic perspective view illustrating the lighting device according to the embodiment.

FIGS. 1 and 2 are schematic perspective views illustrating a lighting device 1 according to the embodiment.

Moreover, FIG. 1 is a schematic perspective view of the lighting device 1 and FIG. 2 is a schematic exploded view of the lighting device 1.

In addition, in FIG. 1, a sealing section 27 is omitted to easily read the view.

As illustrated in FIGS. 1 and 2, the lighting device 1 is provided with a body section 10, a light emitting section 20, and a power supplying section 30.

The body section 10 is provided with a housing section 11, a flange section 12, and fins 13. The housing section 11 has a cylindrical shape and protrudes from one surface of the flange section 12. The light emitting section 20 is housed inside the housing section 11. In addition, power supplying terminals 31 of the power supplying section 30 protrude inside the housing section 11.

A plurality of convex sections 11a protrude on an outer surface of the housing section 11. For example, the plurality of convex sections 11a hold the lighting device 1 in a lamp apparatus (not illustrated) in cooperation with a mounting member of the lamp apparatus when mounting the lighting device 1 on the lamp apparatus (not illustrated) and the like.

In addition, a sealing member formed of a material such as rubber or silicone may be provided between the plurality of convex sections 11a and the flange section 12.

A plurality of convex sections 11b protrude on an inner surface of the housing section 11. The plurality of convex sections 11b are provided to increase rigidity of the housing section 11.

A concave section 11c is provided on the flange section 12 side on the inside of the housing section 11. A substrate 21 of the light emitting section 20 is mounted on the inside of the concave section 11c. In addition, the power supplying terminal 31 of the power supplying section 30 protrudes from a bottom surface of the concave section 11*c*.

The flange section 12 has a disk shape and the housing section 11 is provided on one surface of the flange section 12, and the fins 13 are provided on the other surface of the flange section 12.

A plurality of fins 13 are provided to protrude from the surface of the flange section 12. The plurality of fins 13 have a disk shape and function as radiating fins.

The body section 10 has a function of housing the light emitting section 20, the power supplying section 30, and the like, and a function of radiating heat generated by the light emitting section 20 or the power supplying section 30 to the outside of the lighting device 1.

Thus, it is possible to form the body section 10 from a material having high thermal conductivity in consideration of discharging heat to the outside. For example, the body section 10 can be formed from aluminum, aluminum alloy, resin having the high thermal conductivity, and the like.

In this case, it is possible to form a portion such as the fins 13 from which heat is discharged to the outside from a material having the high thermal conductivity and to form the other portions from resin and the like.

The light emitting section 20 is provided with the substrate 21, light emitting elements 22, control elements 23, a wiring pattern 24, wiring 25, a surrounding wall member 26, and the sealing section 27.

The substrate 21 has a plate shape and is provided with the wiring pattern 24 on a surface thereof.

A material or a structure of the substrate 21 is not specifically limited. For example, the substrate 21 can be formed of an inorganic material (ceramic) such as aluminum oxide or aluminum nitride, an organic material such as paper phenol or glass epoxy, and the like. In addition, the substrate 21 may be a metal plate with a surface coated by an insulator. Moreover, if the surface of the metal plate is coated by the insulator, the insulator may be made of an organic material or may be made of an inorganic material.

In this case, if a heat generation amount of the light emitting element 22 is great, it is preferable that the substrate 21 is formed using a material having high thermal conductivity from the viewpoint of radiation. As the material having the high thermal conductivity, for example, ceramic such as aluminum oxide or aluminum nitride, resin having the high thermal conductivity, a metal plate with a surface coated by the insulator, and the like can be exemplified.

Furthermore, the substrate 21 may have a single layer structure or a multi-layer structure.

A plurality of light emitting elements 22 are mounted on the wiring pattern 24.

The light emitting element 22 has an electrode 28 in the vicinity of one of a plurality of corner portions of a surface (upper surface) opposite to a side on which the wiring pattern 24 is provided or in the vicinity of a center portion of one of a plurality of sides of the surface(see FIGS. 3(*b*) and 3(*c*)). That is, the light emitting element 22 has one electrode 28 in the vicinity of a circumferential edge of the upper surface. Detailed description of the electrode 28 will be described below.

The electrode provided on a lower surface of the light emitting element 22 is electrically connected to a mounting pad 24*c* (see FIG. 7(*b*)) through a conductive thermoset material such as silver paste. The electrode 28 provided on the upper surface of the light emitting element 22 is electrically connected to a wiring pad 24*b* through the wiring 25.

For example, the light emitting element 22 may be a light emitting diode, an organic light emitting diode, a laser diode, and the like.

A light emitting surface of the light emitting element 22 is directed to a front side of the lighting device 1 and light is mainly emitted toward the front side of the lighting device 1.

The number or the size of the light emitting elements 22 is not limited to the example and can be appropriately changed depending on the size or use of the lighting device 1.

Moreover, detailed description regarding embodiments of the light emitting element 22 will be described below.

The control element 23 is mounted on the wiring pattern 24.

The control element 23 controls a current flowing through the light emitting element 22. That is, the control element 23 controls light emitted from the light emitting element 22.

The wiring pattern 24 is provided on at least one surface of the substrate 21.

The wiring pattern 24 can be provided on both surfaces of the substrate 21, but it is preferable that the wiring pattern 24 is provided on one surface of the substrate 21 to reduce the manufacturing cost.

The wiring pattern 24 is provided with an input terminal 24*a*, the wiring pad 24*b*, and the mounting pad 24*c*.

A plurality of input terminals 24*a* are provided. The power supplying terminal 31 of the power supplying section 30 is electrically connected to the input terminal 24*a*. Thus, the light emitting element 22 and the control element 23 are electrically connected to the power supplying section 30 through the wiring pattern 24.

A plurality of wiring pads 24*b* are provided. The wiring pad 24*b* is a portion to which one end of the wiring 25 is connected (see FIG. 7(*b*)).

A plurality of mounting pads 24*c* are provided. The mounting pad 24*c* is a portion to which the light emitting element 22 is connected by using a paste-like thermoset material such as silver paste (see FIG. 7(*b*)).

The wiring 25 electrically connects the electrode 28 which is provided on the upper surface of the light emitting element 22 and the wiring pad 24*b*. For example, the wiring 25 can be a wire which is mainly composed of gold. However, the material of the wiring 25 is not limited to the material which is mainly composed of gold and, for example, may be a material which is mainly composed of cooper or a material which is mainly composed of aluminum.

For example, the wiring 25 is electrically connected to the electrode 28 which is provided on the upper surface of the light emitting element 22 and the wiring pad 24*b* by ultrasonic welding or heat welding. For example, the wiring 25 can be electrically connected to the electrode 28 which is provided on the upper surface of the light emitting element 22 and the wiring pad 24*b* by using a wire bonding method.

The surrounding wall member 26 is provided to surround the plurality of light emitting elements 22. For example, the surrounding wall member 26 has a circular shape and the plurality of light emitting elements 22 are exposed to a center portion 26*a*.

For example, the surrounding wall member 26 can be formed of resin, ceramic, metal such as aluminum, and the like.

A side wall surface of the surrounding wall member 26 on the center portion 26*a* side is an inclined surface. Some of light emitted from the light emitting element 22 is reflected on the side wall surface of the surrounding wall member 26 on the center portion 26a side and is emitted toward the front side of the lighting device 1.

In addition, light, which is some of light emitted from the light emitting element 22 to the front side of the lighting device 1 and is totally reflected on a top surface (interface between the sealing section 27 and outside air) of the sealing section 27, is reflected on the side wall surface of the surrounding wall member 26 on the center portion 26a side and is re-emitted toward the front side of the lighting device 1.

That is, the surrounding wall member 26 also can have a function of a reflector. Moreover, a form of the surrounding wall member 26 is not limited to the illustrated example and can be appropriately changed.

The sealing section 27 is provided in the center portion 26a of the surrounding wall member 26. The sealing section 27 is provided to cover the inside of the surrounding wall member 26.

The sealing section 27 is formed of a material having a light-transmitting property. For example, the sealing section 27 can be formed of a silicone resin.

For example, the sealing section 27 can be formed by filling the center portion 26a of the surrounding wall member 26 with resin. For example, filling with resin can be performed by using a liquid fixed-quantity discharge device such as a dispenser.

If the center portion 26a of the surrounding wall member 26 is filled with resin, it is possible to suppress mechanical contact from outside to the light emitting element 22, the wiring pattern 24, and the wiring 25 which are exposed to the center portion 26a of the surrounding wall member 26. Furthermore, it is possible to suppress attaching of air, moisture, and the like to the light emitting element 22, the wiring pattern 24, and the wiring 25 which are exposed to the center portion 26a of the surrounding wall member 26. Thus, it is possible to increase reliability of the lighting device 1.

In addition, if the center portion 26a of the surrounding wall member 26 is filled with resin, it is possible to decrease a difference in refractive index between the light emitting element 22 and the outside of the light emitting element 22. Thus, it is possible to suppress that some of light emitted from a light emitting layer (not illustrated) of the light emitting element 22 is totally reflected on the interface between the upper surface of the light emitting element 22 and the resin filling the center portion 26a.

In addition, the sealing section 27 may include a phosphor. For example, the phosphor can be a YAG phosphor (yttrium-aluminum-garnet phosphor).

For example, if the light emitting element 22 is a blue light emitting diode and the phosphor is the YAG phosphor, the YAG phosphor is excited by blue light emitted from the light emitting element 22 and yellow fluorescence is emitted from the YAG phosphor. Then, blue light and yellow light are mixed, and thereby white light is emitted from the lighting device 1. Moreover, the type of the phosphor or the type of the light emitting element 22 is not limited to the illustrated example and can be appropriately changed so as to obtain a desired emission color depending on use and the like of the lighting device 1.

The power supplying section 30 is provided with a plurality of power supplying terminals 31.

Plurality of power supplying terminals 31 extend inside the housing section 11 and the flange section 12. One end portion of each of plurality of power supplying terminals 31 protrudes from a bottom surface of the concave section 11c of the housing section 11 and is electrically connected to the input terminal 24a of the wiring pattern 24. The other end portion of each of the plurality of power supplying terminals 31 is exposed from the opposite side of a side of the body section 10 on which the substrate 21 is provided.

Moreover, the number, an arrangement, and a form of the power supplying terminal 31 are not limited to the illustrated example and can be appropriately changed.

In addition, the power supplying section 30 may include a substrate (not illustrated) or a circuit component such as a capacitor and a resistance. Moreover, for example, the substrate (not illustrated) or the circuit component may be provided inside the housing section 11 or the flange section 12.

Additionally, a socket (not illustrated) and the like can be appropriately provided to electrically connect the power supplying terminal 31 to an external power supply and the like. Moreover, for example, the socket (not illustrated) and the like may be provided on a side of the flange section 12 on which the fins 13 are provided.

Next, the embodiment of the light emitting element 22 will be further described.

First, a position of the electrode 28 provided on the upper surface of the light emitting element 22 is illustrated.

FIG. 3 is a schematic view illustrating the position of the electrode provided on the upper surface of the light emitting element 22.

Figure 3A:
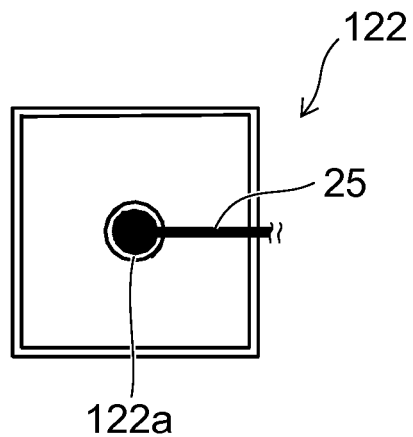
FIG. 3(a) is a schematic view illustrating a position of an electrode provided on an upper surface of a light emitting element according to a comparative example and FIGS. 3(b) and 3(c) are schematic views illustrating a position of an electrode provided on an upper surface of a light emitting element according to the embodiment.

FIG. 3(a) is a schematic view illustrating a position of an electrode 128 provided on the upper surface of a light emitting element 122 according to a comparative example.

Figure 3B:
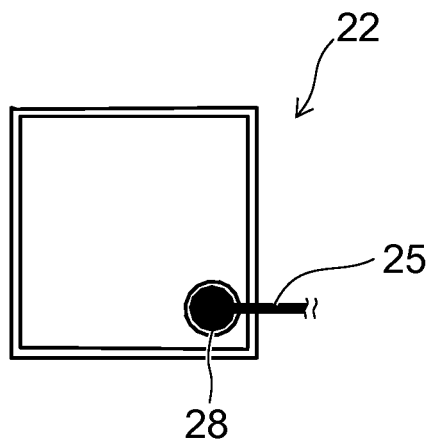
Figure 3C:
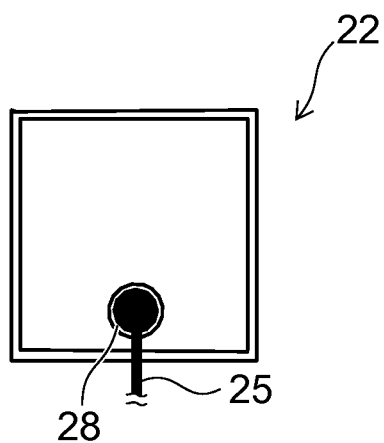

FIGS. 3(b) and 3(c) are schematic views illustrating a position of the electrode 28 provided on the upper surface of the light emitting element 22 according to the embodiment.

FIG. 3(a) shows a configuration in which the electrode 128 is provided in a center portion of an upper surface of a light emitting element 122. If the electrode 128 is provided in the center portion of the upper surface of the light emitting element 122, it is possible to connect the wiring 25 of equal length to the electrode 128 from any direction. However, if the electrode 128 is provided in the center portion of the upper surface of the light emitting element 122, a distance in which the wiring 25 crosses above the upper surface of the light emitting element 122 which is the light emitting surface is increased. Thus, light emitted from the light emitting element 122 is blocked by the wiring 25 and there is a concern that the light extraction efficiency is deteriorated.

Thus, in the light emitting element 22 according to the embodiment, as illustrated in FIG. 3(b), the electrode 28 is provided in the vicinity of one of a plurality of corner portions of the upper surface of the light emitting element 22.

Furthermore, as illustrated in FIG. 3(c), the electrode 28 may be provided in the vicinity of the center portion of one of a plurality of sides of the upper surface of the light emitting element 22.

Moreover, the position of the electrode 28 can be appropriately changed. That is, one electrode 28 may be provided in the vicinity of a circumference edge of the upper surface of the light emitting element 22.

In this way, it is possible to decrease the distance in which the wiring 25 crosses above the upper surface of the light emitting element 22 which is the light emitting surface compared to the configuration of FIG. 3(a). Thus, it is possible to reduce blocking of light emitted from the light emitting element 22 by the wiring 25 and to improve the light extraction efficiency.

Here, if the electrode 28 is provided in the vicinity of one of the plurality of corner portions of the upper surface of the light emitting element 22 or in the vicinity of the center portion of one of the plurality of sides of the upper surface of the light emitting element 22, directionality is generated when mounting the light emitting element 22.

In this case, if the plurality of light emitting elements 22 are mounted on the substrate 21 such that the electrodes 28 of the plurality of light emitting elements 22 have the same direction, it is possible to reduce the cost in a mounting process.

Figure 4A:
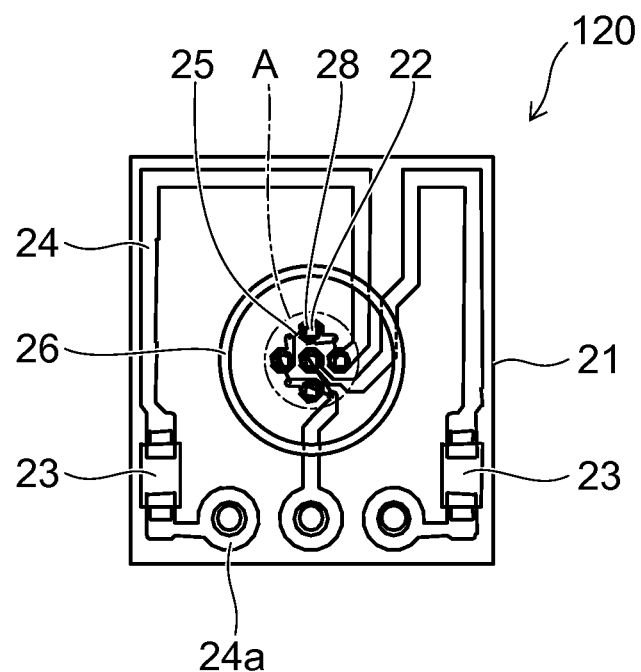
FIGS. 4(a) and 4(b) are schematic views illustrating a mounting form of the light emitting element according to a comparative example.
Figure 4B:
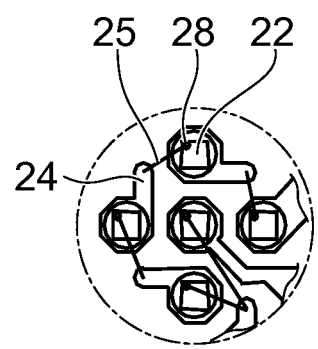

FIGS. 4(a) and 4(b) are schematic views illustrating a mounting form of a light emitting element 22 according to a comparative example.

Moreover, FIG. 4(a) is a schematic view illustrating the mounting form in a light emitting section 120 according to the comparative example.

FIG. 4(b) is an enlarged view of an A portion in FIG. 4(a).

Figure 5A:
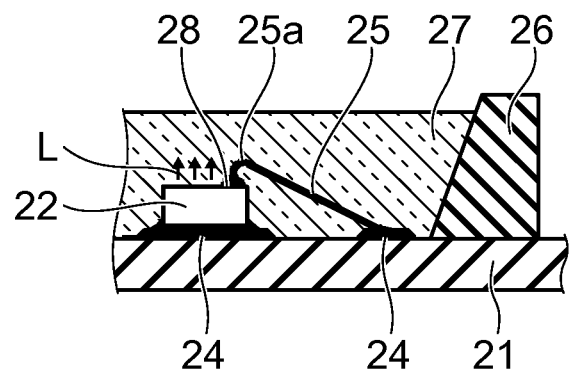
FIGS. 5(a) and 5(b) are schematic views illustrating a connection state of wiring.
Figure 5B:
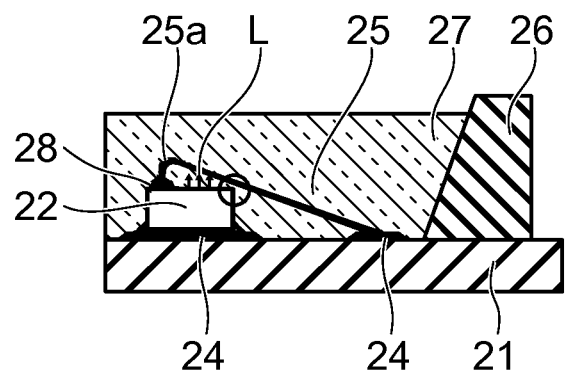

FIGS. 5(a) and 5(b) are schematic views illustrating a connection state of the wiring 25.

As illustrated in FIGS. 4(a) and 4(b), if the plurality of light emitting elements 22 are mounted on the substrate 21 such that the electrodes 28 of the plurality of light emitting elements 22 have the same direction, it is possible to reduce the cost in a mounting process.

However, as illustrated in FIG. 4(b), the distance in which the wiring 25 crosses above the upper surface of the light emitting element 22 which is the light emitting surface may be increased.

As illustrated in FIG. 5(a), if the distance in which the wiring 25 crosses above the upper surface of the light emitting element 22 is short, it is possible to reduce blocking of light L emitted from the light emitting element 22 by the wiring 25. Since there is no concern that the wiring 25 comes into contact with the upper surface of the light emitting element 22, it is possible to lower a bending position 25a of the wiring 25. Thus, it is possible to lower a height dimension of the sealing section 27 and to reduce the volume of the sealing section 27.

On the contrary, as illustrated in FIG. 5(b), if the distance in which the wiring 25 crosses above the upper surface of the light emitting element 22 is long, the amount of light L emitted from the light emitting element 22 which is blocked by the wiring 25 is increased. Thus, there is a concern that the light extraction efficiency is deteriorated.

Furthermore, in a B portion in FIG. 5(b), there is a concern that the wiring 25 comes into contact with the upper surface of the light emitting element 22. Thus, it is necessary to increase the height of the bending position 25a of the wiring 25. As a result, height dimension of the sealing section 27 is increased and the volume of the sealing section 27 is increased.

Here, the heat stress, the expansion, and the contraction are generated in the sealing section 27 by turning on and turning off of the light emitting element 22. In this case, if the volume of the sealing section 27 is increased, influences of the heat stress, the expansion, and the contraction are increased and there is a concern that defects occur in a part of the plurality of light emitting elements 22 and the wiring 25 which are sealed by the sealing section 27.

For example, there is a concern that the light emitting element 22 is separated from the substrate 21 or the wiring 25 is disconnected.

Furthermore, if the volume of the sealing section 27 is increased, the material cost is increased.

In this case, it is possible to reduce the distance in which the wiring 25 crosses above the upper surface of the light emitting element 22 by changing the wiring pattern 24.

Figure 6A:
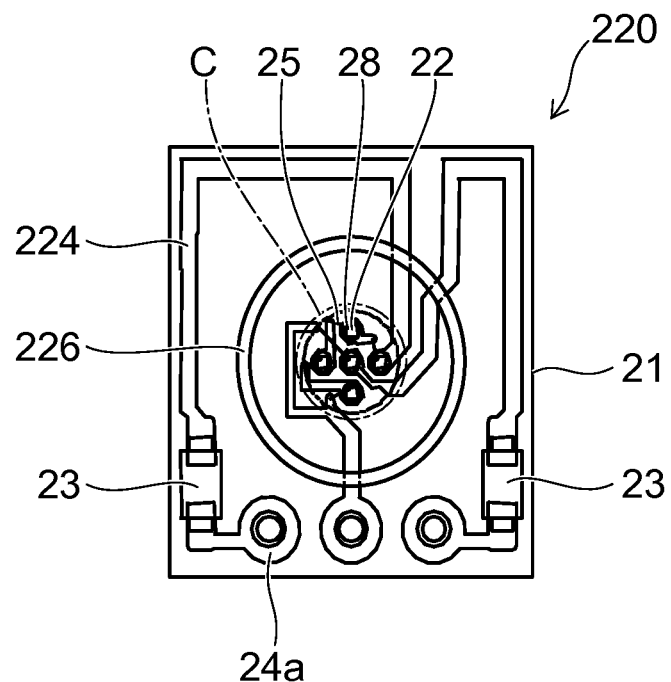
FIGS. 6(a) and 6(b) are schematic views illustrating a relationship of a connection state between a wiring pattern and wiring according to the comparative example.
Figure 6B:
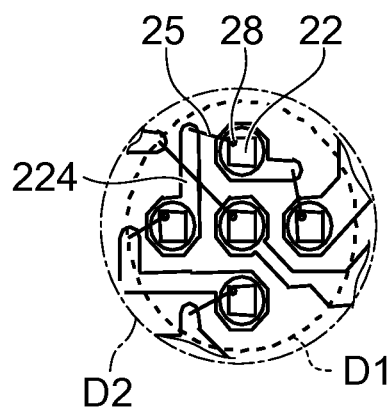

FIGS. 6(a) and 6(b) are schematic views illustrating a relationship of the connection state between a wiring pattern 224 and the wiring 25 according to the comparative example.

Moreover, FIG. 6(a) is a schematic view illustrating a mounting form in a light emitting section 220 on which the wiring pattern 224 is provided according to the comparative example.

FIG. 6(b) is an enlarged view of a C portion in FIG. 6(a).

As illustrated in FIGS. 6(a) and 6(b), also in the light emitting section 220, the plurality of light emitting elements 22 are mounted on the substrate 21 such that the electrodes 28 of the plurality of light emitting elements 22 have the same direction.

Then, the distance in which the wiring 25 crosses above the upper surface of the light emitting element 22 is decreased by changing the wiring pattern 224.

In this way, it seems that the problem described in FIGS. 4 and 5 is able to be solved.

However, in this way, as illustrated in FIG. 6(b), a connection position between the wiring 25 and the wiring pad 24b is moved to the circumference edge side of the substrate 21.

Thus, an occupied region (region D2 in FIG. 6(b)) is greater than an occupied region (region D1 in FIG. 6(b)) in FIG. 5(b).

It means that the volume of the sealing section 27 is increased as the size of a surrounding wall member 226 is increased.

Thus, it is possible to improve the light extraction efficiency, but not to reduce the volume of the sealing section 27.

Next, the mounting form of the light emitting element 22 according to the embodiment will be described.

In the following description, as an example, a case where the electrode 28 is provided in the vicinity of one of the plurality of corner portions of the upper surface will be described.

Moreover, a case where the electrode 28 is provided in the vicinity of the center portion of one of the plurality of sides of the upper surface can be similar to the following case. That is, a case where one electrode 28 is provided in the vicinity of the circumference edge of the upper surface of the light emitting element 22 can be similar to the following case.

Figure 7A:
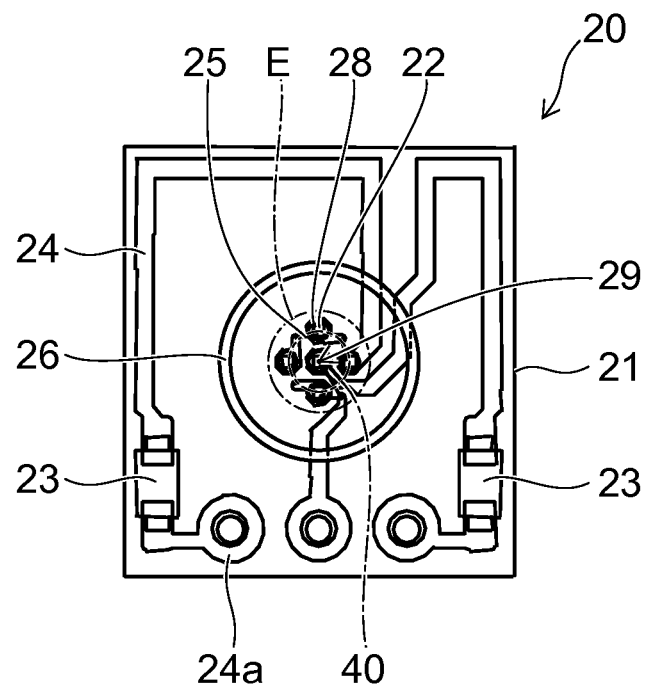
FIGS. 7(a) and 7(b) are schematic views illustrating a mounting form of the light emitting element according to the embodiment.
Figure 7B:
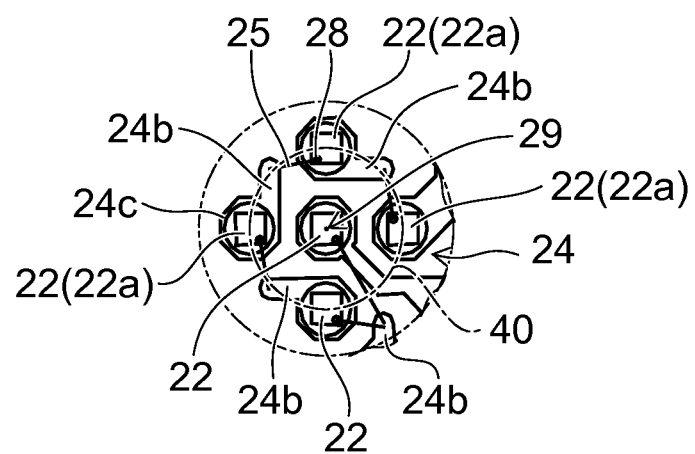

FIGS. 7(a) and 7(b) are schematic views illustrating a mounting form of the light emitting element 22 according to the embodiment.

Moreover, FIG. 7(a) is a schematic view illustrating the mounting form of the light emitting element 22 in the light emitting section 20.

FIG. 7(b) is an enlarged view of an E portion in FIG. 7(a).

The light emitting section 20 illustrated in FIGS. 7(a) and 7(b) is provided with four light emitting elements 22 centered on one light emitting element 22 in directions perpendicular to each other. Furthermore, a distance from a center of the light emitting element 22 provided in the center to a center of each light emitting element 22 provided in the circumference is equal to each other.

That is, the light emitting section 20 has one light emitting element 22 provided in a first position 29 and four light emitting elements 22 provided at the same distribution on the circumference (on circumference of a virtual circle 40) centered on the first position 29.

Furthermore, four light emitting elements 22 provided in the circumference are connected in series.

Then, positions of the respective electrodes 28 have the rotational symmetry centered on the first position 29 in the electric connection between the light emitting element 22 and the light emitting element 22 in the plurality of light emitting elements 22 which are connected in series.

For example, positions of the respective electrodes 28 have the rotational symmetry centered on the first position 29 in the electric connection between a light emitting element 22a and the light emitting element 22a in three light emitting elements 22a in FIG. 7(b).

Furthermore, each of the electrodes 28 is provided inside the virtual circle 40.

That is, in the embodiment, a plurality of electrodes 28 are respectively positioned inside the circumference passing through the centers of the plurality of light emitting elements 22a connected in series centered on the first position 29 in the electric connection between the light emitting element 22a and the light emitting element 22a in the plurality of light emitting elements connected in series.

Moreover, the virtual circle 40 is a circle passing through the center of each light emitting element 22a centered on the first position 29.

Furthermore, the first position 29 on the substrate 21 can be an arbitrary position. For example, in a case illustrated in FIG. 7(a), the center of the substrate 21 is the first position 29.

Furthermore, five light emitting elements 22 and 22a are provided in positions in which distances between the plurality of wiring pads 24b and the plurality of electrodes 28 are respectively the shortest.

According to the embodiment illustrated in FIGS. 7(a) and 7(b), the connection position between the wiring 25 and the wiring pattern 24 (wiring pad 24b) can be close to the first position 29. Thus, the size of the surrounding wall member 26 can be decreased and the volume of the sealing section 27 can be decreased.

Furthermore, it is possible to shorten the distance in which the wiring 25 crosses above the upper surface of the light emitting elements 22 and 22a, and to improve the light extraction efficiency.

Furthermore, since the surrounding wall member 26 is provided in the lighting device 1, it is possible to regulate the volume (capacity for being filled (injected) with resin and the like) of the sealing section 27 to a small capacity (small range). Thus, it is possible to suppress stress, expansion, and contraction of the sealing section 27 to be lower than a sealing section having a large capacity. As a result, it is possible to suppress influences on a part of the plurality of light emitting elements 22 and the wirings 25 sealed by the sealing section 27, for example, separation of the light emitting element 22 or disconnection of the wiring 25.

Furthermore, in the lighting device 1, since the volume of the sealing section 27 has a small capacity, it is possible to suppress occurrence of cracks of the sealing section 27 to be lower than that of the sealing section having a large capacity. As a result, sealing performance of the sealing section 27 can be improved, and it is possible to improve a yield of manufacture of the lighting device 1.

Furthermore, in the lighting device 1, since the volume of the sealing section 27 is the small capacity, it is possible to reduce the manufacturing cost. Furthermore, since a time for filling the sealing section 27 can be reduced, it is possible to shorten a manufacturing time and reduce the manufacturing cost.

Figure 8A:
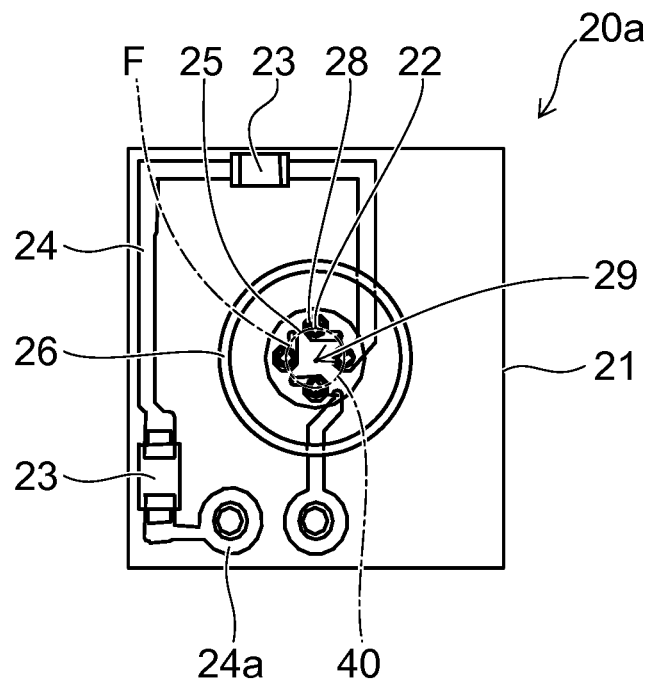
FIGS. 8(a) and 8(b) are schematic views illustrating a mounting form of a light emitting element according to another embodiment.
Figure 8B:
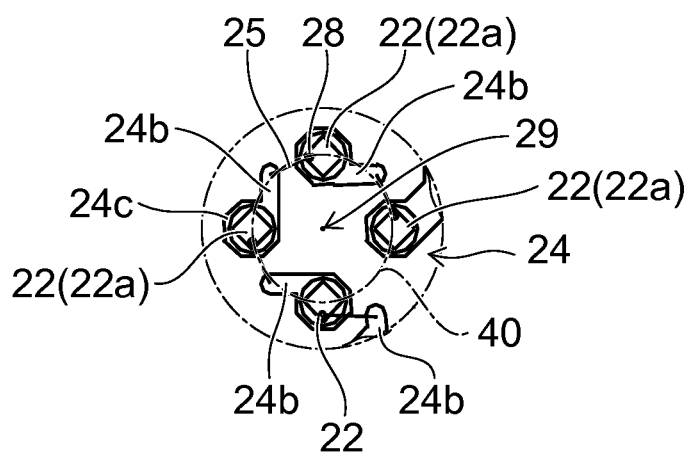

FIGS. 8(a) and 8(b) are schematic views illustrating a mounting form of the light emitting element 22 according to another embodiment.

Moreover, FIG. 8(a) is a schematic view illustrating the mounting form of the light emitting element 22 in a light emitting section 20a.

FIG. 8(b) is an enlarged view of an F portion in FIG. 8(a).

The light emitting section 20a illustrated in FIGS. 8(a) and 8(b) is provided with four light emitting elements 22 centered on the first position 29 in directions perpendicular to each other. Furthermore, a distance from the first position 29 to a center of each light emitting element 22 is equal to each other.

That is, the light emitting section 20 has four light emitting elements 22 provided at the same distribution on the circumference (on circumference of the virtual circle 40) centered on the first position 29.

Furthermore, the four light emitting elements 22 are connected in series.

Then, positions of the respective electrodes 28 have the rotational symmetry centered on the first position 29 in the electric connection between the light emitting element 22 and the light emitting element 22 in the plurality of light emitting elements 22 which are connected in series.

For example, positions of the respective electrodes 28 have the rotational symmetry centered on the first position 29 in the electric connection between the light emitting element 22a and the light emitting element 22a in three light emitting elements 22a in FIG. 8(b).

Moreover, the light emitting elements 22 (22a) in FIG. 8(b) are a case where the light emitting elements 22 (22a) provided on the circumference in FIG. 7(b) are respectively rotated approximately 45° with respect to the center of the light emitting element 22 (22a).

That is, in the embodiment, the plurality of electrodes 28 are respectively positioned on the circumference passing through the centers of the plurality of light emitting elements 22a which are connected in series centered on the first position 29 in the electric connection between the light emitting element 22a and the light emitting element 22a in the plurality of light emitting elements which are connected in series.

Furthermore, four light emitting elements 22 and 22a are provided in positions in which distances between the plurality of wiring pads 24b and the plurality of electrodes 28 are respectively the shortest.

In the embodiment, it is possible to achieve the same effects as those of the embodiment illustrated in FIGS. 7(a) and 7(b).

Figure 9A:
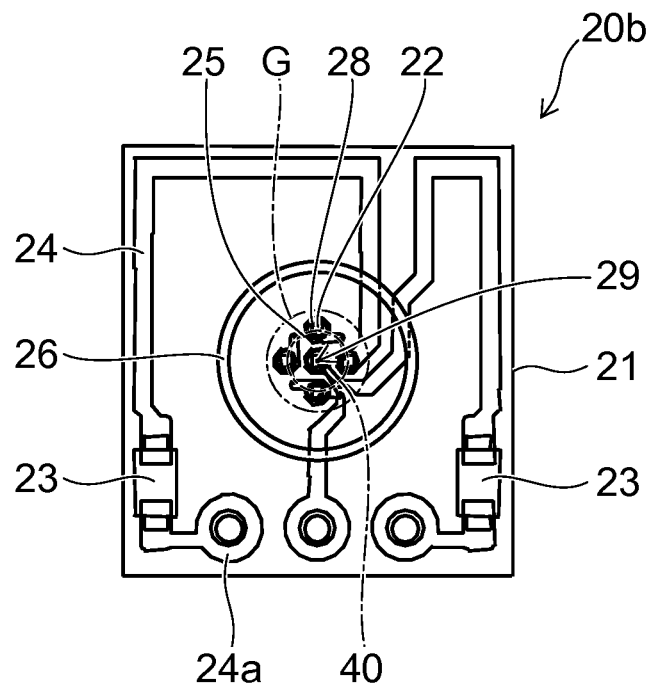
FIGS. 9(a) and 9(b) are schematic views illustrating a mounting form of a light emitting element according to another embodiment.
Figure 9B:
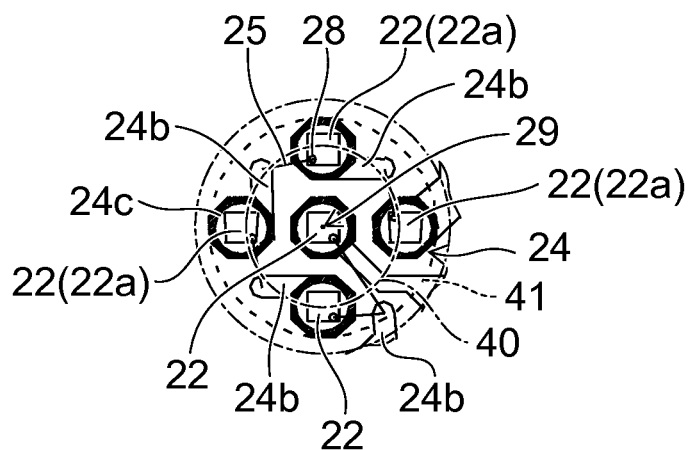

FIGS. 9(a) and 9(b) are schematic views illustrating a mounting form of a light emitting element 22 according to another embodiment.

Moreover, FIG. 9(a) is a schematic view illustrating the mounting form of the light emitting element 22 in a light emitting section 20b.

FIG. 9(b) is an enlarged view of a G portion in FIG. 9(a).

The light emitting section 20b illustrated in FIGS. 9(a) and 9(b) is provided with four light emitting elements 22 respectively centered on one light emitting element 22 in directions perpendicular to each other.

Furthermore, four light emitting elements 22 provided on the circumference are connected in series.

Moreover, an arrangement form of each light emitting element 22 and each electrode 28 in the light emitting section 20b is similar to the arrangement form of each light emitting element 22 and each electrode 28 in the light emitting section 20 illustrated in FIGS. 7(a) and 7(b).

That is, in the embodiment, the plurality of electrodes are respectively positioned inside the circumference passing through the centers of the plurality of light emitting elements 22a which are connected in series centered on the first position 29 in the electric connection between the light emitting element 22a and the light emitting element 22a in the plurality of light emitting elements which are connected in series.

Furthermore, as illustrated in FIGS. 9(a) and 9(b), in the light emitting section 20b, all of the electrode 28, a connection portion between the wiring pad 24b and the wiring 25, and the mounting pad 24c are provided inside a virtual circle 41 passing through the outermost peripheral end of the mounting pads 24c centered on the first position 29.

Furthermore, five light emitting elements 22 and 22a are provided in positions in which distances between the plurality of wiring pads 24b and the plurality of electrodes 28 are respectively the shortest.

In the embodiment, it is possible to achieve the same effects as those of the embodiment illustrated in FIGS. 7(a) and 7(b).

Figure 10A:
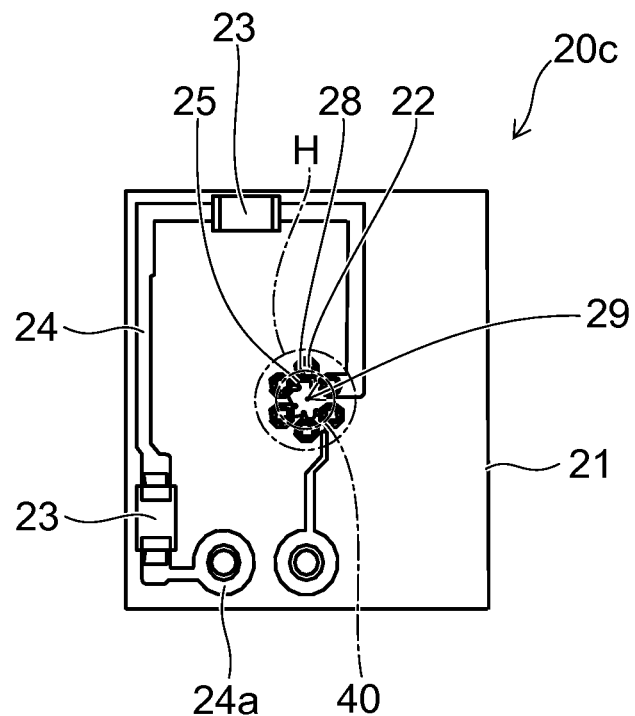
FIGS. 10(a) and 10(b) are schematic views illustrating a mounting form of a light emitting element according to another embodiment.
Figure 10B:
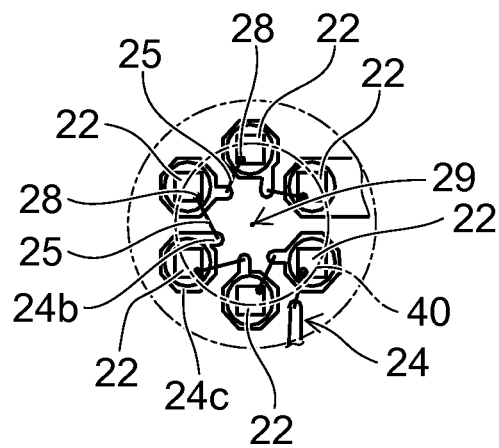

FIGS. 10(a) and 10(b) are schematic views illustrating a mounting form of a light emitting element 22 according to another embodiment.

Moreover, FIG. 10(a) is a schematic view illustrating the mounting form of the light emitting element 22 in a light emitting section 20c.

In FIG. 10(a), the surrounding wall member 26 is omitted.

FIG. 10(b) is an enlarged view of an H portion in FIG. 10(a).

As illustrated in FIGS. 10(a) and 10(b), the light emitting section 20c has six light emitting elements 22 provided at the same distribution on the circumference (on circumference of the virtual circle 40) centered on the first position 29.

Furthermore, the six light emitting elements 22 are connected in series.

Furthermore, the electrodes 28 are respectively provided inside the virtual circle 40 in the electric connection between the light emitting element 22 and the light emitting element 22 in the plurality of light emitting elements which are connected in series.

Furthermore, six light emitting elements 22 and 22a are provided in positions in which distances between the plurality of wiring pads 24b and the plurality of electrodes 28 are respectively the shortest.

That is, in the embodiment, the plurality of electrodes are respectively positioned inside the circumference passing through the centers of the plurality of light emitting elements 22 which are connected in series centered on the first position 29 in the electric connection between the light emitting element 22 and the light emitting element 22 in the plurality of light emitting elements which are connected in series.

In the embodiment, it is possible to achieve the same effects as those of the embodiment illustrated in FIGS. 7(a) and 7(b).

Figure 11A:
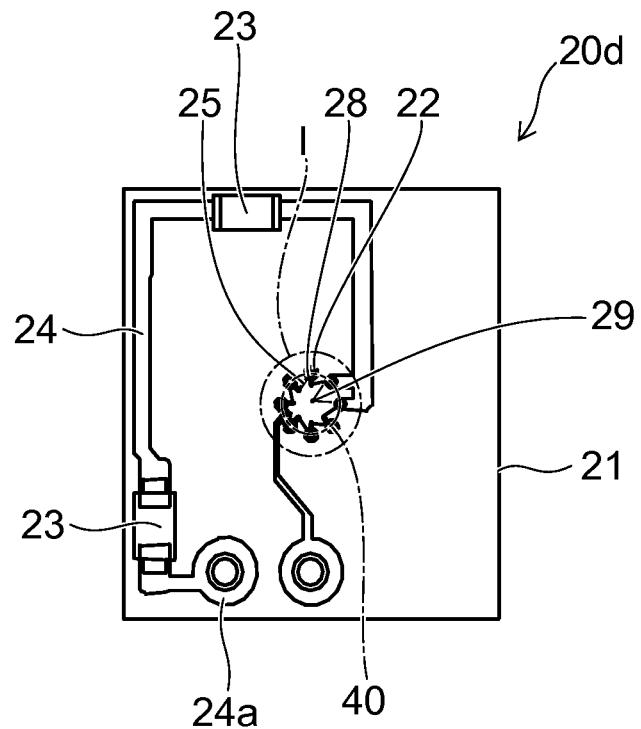
FIGS. 11(a) and 11(b) are schematic views illustrating a mounting form of a light emitting element according to another embodiment.
Figure 11B:
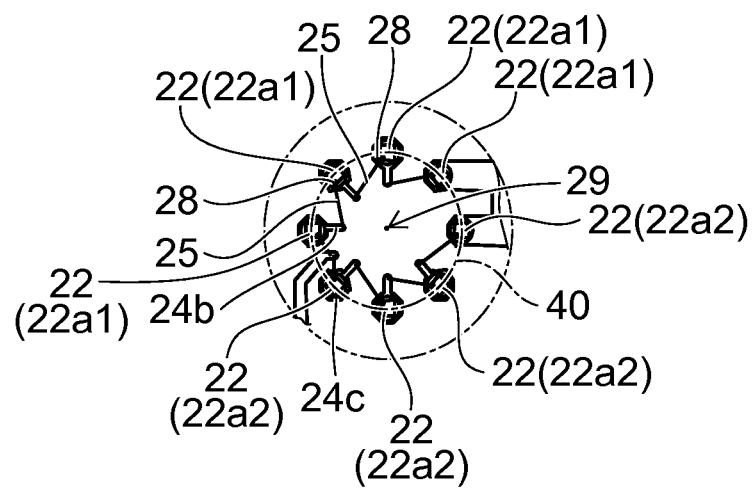

FIGS. 11(a) and 11(b) are schematic views illustrating a mounting form of a light emitting element 22 according to another embodiment.

Moreover, FIG. 11(a) is a schematic view illustrating the mounting form of the light emitting element 22 in a light emitting section 20d.

In FIG. 11(a), the surrounding wall member 26 is omitted.

FIG. 11(b) is an enlarged view of an I portion in FIG. 11(a).

As illustrated in FIGS. 11(a) and 11(b), the light emitting section 20d has eight light emitting elements 22 provided at the same distribution on the circumference (on circumference of the virtual circle 40) centered on the first position 29.

Furthermore, four light emitting elements 22a1 which are connected in series and four light emitting elements 22a2 which are connected in series are connected in parallel.

Furthermore, the electrodes 28 are respectively provided inside the virtual circle 40 in the electric connection between the light emitting element 22a1 and the light emitting element 22a1 in the four light emitting elements 22a1 which are connected in series.

Furthermore, the electrodes 28 are respectively provided inside the virtual circle 40 in the electric connection between the light emitting element 22a2 and the light emitting element 22a2 in the four light emitting elements 22a2 which are connected in series.

Furthermore, positions of the respective electrodes 28 have the rotational symmetry centered on the first position 29 in the electric connection between the light emitting element 22a1 and the light emitting element 22a1 in the four light emitting elements 22a1 which are connected in series.

Furthermore, positions of the respective electrodes 28 have the rotational symmetry centered on the first position 29 in the electric connection between the light emitting element 22a2 and the light emitting element 22a2 in the four light emitting elements 22a2 which are connected in series.

Furthermore, eight light emitting elements 22 and 22a are provided in positions in which distances between the plurality of wiring pads 24b and the plurality of electrodes 28 are respectively the shortest.

That is, in the embodiment, the plurality of electrodes are respectively positioned inside the circumference passing through the centers of the plurality of light emitting elements 22a1 and 22a2 which are connected in series centered on the first position 29 in the electric connection between the light emitting elements 22a1 and 22a2, and the light emitting elements 22a1 and 22a2 in the plurality of light emitting elements 22a1 and 22a2 which are connected in series.

In the embodiment, it is possible to achieve the same effects as those of the embodiment illustrated in FIGS. 7(a) and 7(b).

Figure 12A:
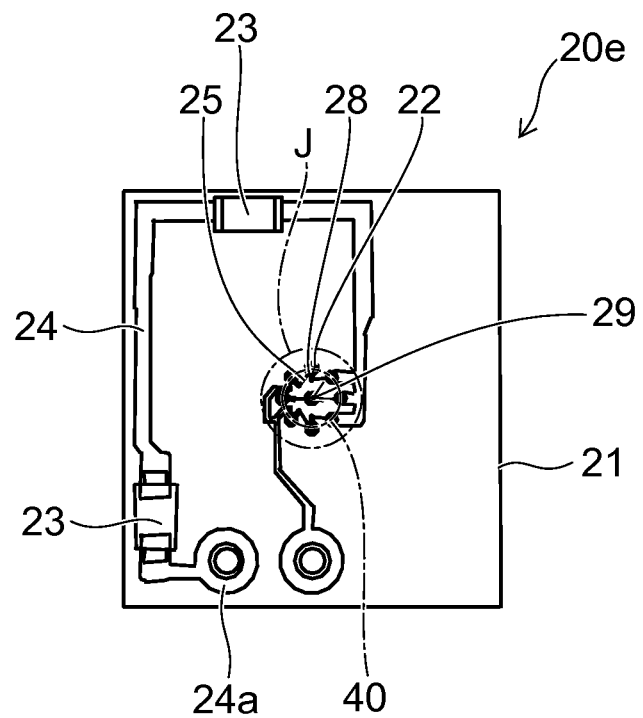
FIGS. 12(a) and 12(b) are schematic views illustrating a mounting form of a light emitting element according to another embodiment.
Figure 12B:
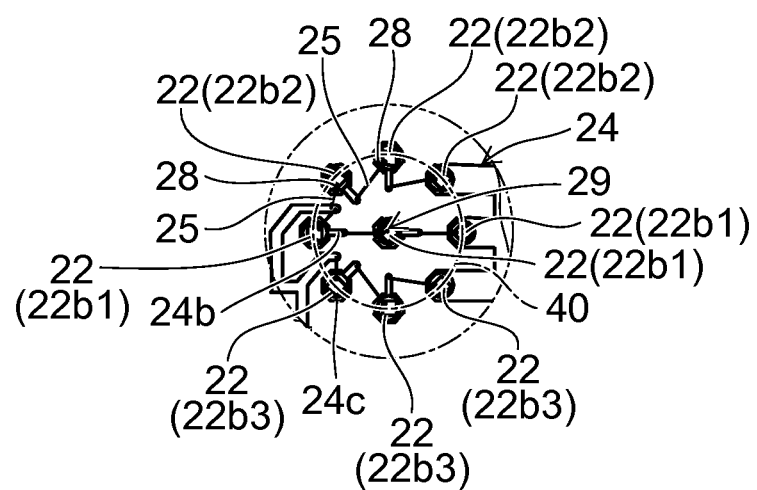

FIGS. 12(a) and 12(b) are schematic views illustrating a mounting form of a light emitting element 22 according to another embodiment.

Moreover, FIG. 12(a) is a schematic view illustrating the mounting form of the light emitting element 22 in a light emitting section 20e.

In FIG. 12(a), the surrounding wall member 26 is omitted.

FIG. 12(b) is an enlarged view of a J portion in FIG. 12(a).

As illustrated in FIGS. 12(a) and 12(b), the light emitting section 20e has one light emitting element 22b1 provided in the first position 29 and eight light emitting elements 22b1, 22b2, and 22b3 provided at the same distribution on the circumference (on circumference of the virtual circle 40) centered on the first position 29.

Furthermore, three light emitting elements 22b1 which are connected in series, three light emitting elements 22b2 which are connected in series, and three light emitting elements 22b3 which are connected in series are connected in parallel.

Furthermore, the electrodes 28 are respectively provided inside the virtual circle 40 in the electric connection between the light emitting element 22b1 and the light emitting element 22b1 in the three light emitting elements 22b1 which are connected in series.

Furthermore, the electrodes 28 are respectively provided inside the virtual circle 40 in the electric connection between the light emitting element 22b2 and the light emitting element 22b2 in the three light emitting elements 22b2 which are connected in series.

Furthermore, the electrodes 28 are respectively provided inside the virtual circle 40 in the electric connection between the light emitting element 22b3 and the light emitting element 22b3 in the three light emitting elements 22b3 which are connected in series.

Furthermore, positions of the respective electrodes 28 have the rotational symmetry centered on the first position 29 in the electric connection between the light emitting element 22b2 and the light emitting element 22b2 in the three light emitting elements 22b2 which are connected in series.

Furthermore, positions of the respective electrodes 28 have the rotational symmetry centered on the first position 29 in the electric connection between the light emitting element 22b3 and the light emitting element 22b3 in the three light emitting elements 22b3 which are connected in series.

Furthermore, nine light emitting elements 22b1, 22b2, and 22b3 are provided in positions in which distances between the plurality of wiring pads 24b and the plurality of electrodes 28 are respectively the shortest.

That is, in the embodiment, the plurality of electrodes are respectively positioned inside the circumference passing through the centers of the plurality of light emitting elements 22b2 and 22b3 which are connected in series centered on the first position 29 in the electric connection between the light emitting elements 22b2 and 22b3, and the light emitting elements 22b2 and 22b3 in the plurality of light emitting elements 22b2 and 22b3 which are connected in series.

In the embodiment, it is possible to achieve the same effects as those of the embodiment illustrated in FIGS. 7(a) and 7(b).

Figure 13A:
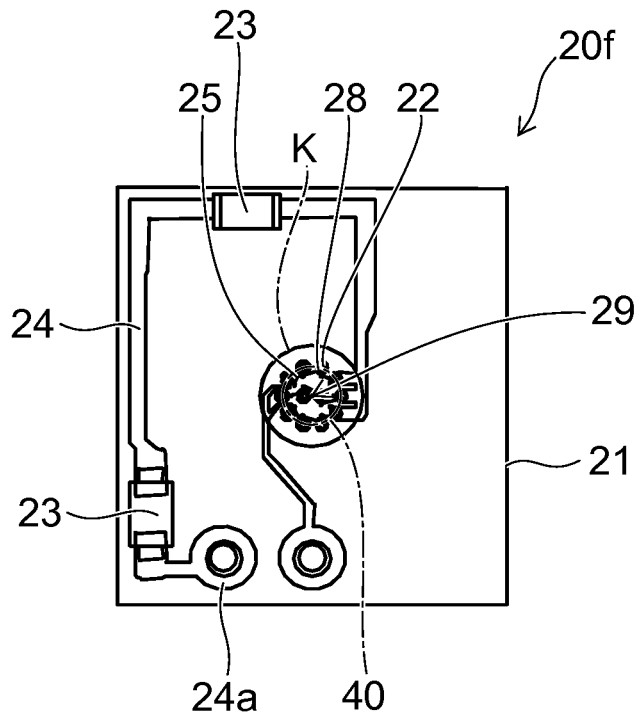
FIGS. 13(a) and 13(b) are schematic views illustrating amounting form of a light emitting element according to another embodiment.
Figure 13B:
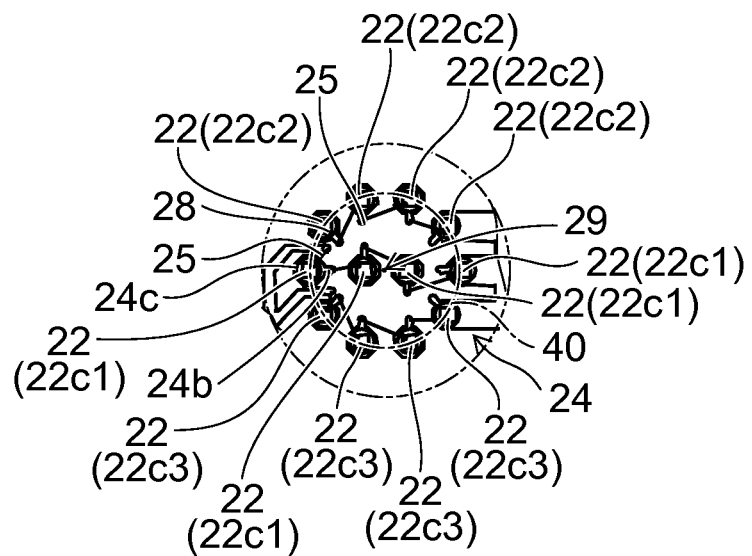

FIGS. 13(a) and 13(b) are schematic views illustrating a mounting form of a light emitting element 22 according to another embodiment.

Moreover, FIG. 13(a) is a schematic view illustrating the mounting form of the light emitting element 22 in a light emitting section 20f.

In FIG. 13 (a), the surrounding wall member 26 is omitted.

FIG. 13(b) is an enlarged view of a K portion in FIG. 13(a).

As illustrated in FIGS. 13(a) and 13(b), the light emitting section 20f has two light emitting element 22c1 provided to interpose the first position 29 and ten light emitting elements 22c1, 22c2, and 22c3 provided in the same distribution on the circumference (on circumference of the virtual circle 40) centered on the first position 29.

Furthermore, four light emitting elements 22c1 which are connected in series, four light emitting elements 22c2 which are connected in series, and four light emitting elements 22c3 which are connected in series are connected in parallel.

Furthermore, the electrodes 28 are respectively provided inside the virtual circle 40 in the electric connection between the light emitting element 22c1 and the light emitting element 22c1 in the four light emitting elements 22c1 which are connected in series.

Furthermore, the electrodes 28 are respectively provided inside the virtual circle 40 in the electric connection between the light emitting element 22c2 and the light emitting element 22c2 in the four light emitting elements 22c2 which are connected in series.

Furthermore, the electrodes 28 are respectively provided inside the virtual circle 40 in the electric connection between the light emitting element 22c3 and the light emitting element 22c3 in the four light emitting elements 22c3 which are connected in series.

Furthermore, twelve light emitting elements 22c1, 22c2, and 22c3 are provided in positions in which distances between the plurality of wiring pads 24b and the plurality of electrodes 28 are respectively the shortest.

That is, in the embodiment, the plurality of electrodes are respectively positioned inside the circumference passing through the centers of the plurality of light emitting elements 22c2 and 22c3 which are connected in series centered on the first position 29 in the electric connection between the light emitting elements 22c2 and 22c3, and the light emitting elements 22c2 and 22c3 in the plurality of light emitting elements 22c2 and 22c3 which are connected in series.

In the embodiment, it is possible to achieve the same effects as those of the embodiment illustrated in FIGS. 7(a) and 7(b).

In the above description, several embodiments of the invention are illustrated, but these embodiments are those presented as examples and are not intended to limit the scope of the invention. These novel embodiments may be implemented in various other forms without departing from the scope of the invention and various omissions, substitutions, changes, and the like can be performed without departing from the scope of the invention. These embodiments or modifications are included in the scope or the gist of the invention, and are included in the invention described in the claims, and the scope of its equivalents. Furthermore, each embodiment described above can be implemented in combination with the others.

The invention claimed is:

1. A lighting device comprising:
a body section;
a substrate that is provided in the body section;
a wiring pattern that is provided on a surface of the substrate and has a plurality of wiring pads;
a plurality of light emitting elements that are provided on the wiring pattern, each of the plurality of light emitting elements having one electrode in the vicinity of a circumferential edge of an upper surface of the light emitting elements;
a plurality of wirings that respectively connect the plurality of wiring pads and a plurality of electrodes;
a surrounding wall member that is provided so as to surround the plurality of light emitting elements, the plurality of wiring pads, and the plurality of electrodes, and has an annular shape; and
a sealing section that is provided so as to cover the inside of the surrounding wall member,
wherein at least a part of the plurality of light emitting elements is connected in series, and
wherein the plurality of electrodes are respectively positioned on or inside a circumference passing through centers of the plurality of light emitting elements, which are connected in series, centered on a first position in electric connection between a first light emitting element and a second light emitting element in the plurality of light emitting elements connected in series.

2. The device according to claim 1, wherein positions of the respective electrodes have a rotational symmetry centered on the first position in the electric connection between the first light emitting element and the second light emitting element in the plurality of light emitting elements connected in series.

3. The device according to claim 1, wherein the plurality of light emitting elements are respectively provided in positions where distances between the plurality of wiring pads and the plurality of electrodes respectively become the shortest.

4. The device according to claim 1,
wherein the wiring pattern has the plurality of mounting pads to which the plurality of light emitting elements are respectively connected, and
wherein the plurality of electrodes and connection portions between the wiring pads and the wirings are positioned inside a circumference passing through outermost circumference ends of the plurality of mounting pads centered on the first position.

5. The device according to claim 1, further comprising:
a power supplying terminal of which one end is electrically connected to the wiring pattern and another end is exposed from an opposite side of a side of the body section on which the substrate is provided.

6. A lighting device comprising:
a body section;
a substrate that is provided in the body section;
a wiring pattern that is provided on a surface of the substrate and has a plurality of wiring pads;
a plurality of light emitting elements that are provided on the wiring pattern, each of the plurality of light emitting elements having one electrode closer to a circumferential edge of an upper surface of the light emitting elements than to a side of the light emitting elements on which the wiring pattern is provided;
a plurality of wirings that respectively connect the plurality of wiring pads and a plurality of electrodes;
a surrounding wall member that is provided so as to surround the plurality of light emitting elements, the plurality of wiring pads, and the plurality of electrodes, and has an annular shape; and
a sealing section that is provided so as to cover the inside of the surrounding wall member,
wherein at least a part of the plurality of light emitting elements is connected in series, and
wherein the plurality of electrodes are respectively positioned on or inside a circumference passing through centers of the plurality of light emitting elements, which are connected in series, centered on a first position in electric connection between a first light emitting element and a second light emitting element in the plurality of light emitting elements connected in series.

* * * * *